US012735790B2

(12) United States Patent
Bagchi et al.

(10) Patent No.: US 12,735,790 B2
(45) Date of Patent: Sep. 15, 2026

(54) WAFER CARRIER ASSEMBLY WITH IMPROVED TEMPERATURE UNIFORMITY

(71) Applicant: Veeco Instruments Inc., Plainview, NY (US)

(72) Inventors: Aniruddha Bagchi, Princeton, NJ (US); Sandeep Krishnan, Princeton Junction, NJ (US); Eric Armour, Pennington, NJ (US); Michael Chansky, Hillsborough, NJ (US); Yuliy Rashkovsky, Milburn, NJ (US); Andrew Hanser, Delray Beach, FL (US); Matthew Van Doren, Roxbury, CT (US); William Wangard, III, Dover, NH (US)

(73) Assignee: Veeco Instruments Inc., Plainview, NY (US)

( * ) Notice: Subject to any disclaimer, the term of this patent is extended or adjusted under 35 U.S.C. 154(b) by 503 days.

(21) Appl. No.: 18/365,629

(22) Filed: Aug. 4, 2023

(65) Prior Publication Data

US 2024/0102166 A1 Mar. 28, 2024

Related U.S. Application Data

(60) Provisional application No. 63/409,557, filed on Sep. 23, 2022.

(51) Int. Cl.
*H10P 72/76* (2026.01)
*C23C 16/458* (2006.01)

(52) U.S. Cl.
CPC ...... *C23C 16/4585* (2013.01); *H10P 72/7621* (2026.01); *H10P 72/7624* (2026.01)

(58) Field of Classification Search
CPC ........... C23C 16/4585; H01L 21/68771; H01L 21/68785; H10P 72/7624
See application file for complete search history.

(56) References Cited

U.S. PATENT DOCUMENTS

2019/0157125 A1 5/2019 Gurary et al.
2019/0295880 A1* 9/2019 Krishnan .......... H01L 21/67248
(Continued)

FOREIGN PATENT DOCUMENTS

JP 2007109771 A * 4/2007

OTHER PUBLICATIONS

International Search Report in PCT Application No. PCT/US2023/071689, mailed Dec. 13, 2023 (9 pages).

*Primary Examiner* — Yuechuan Yu
(74) *Attorney, Agent, or Firm* — Leason Ellis LLP

(57) ABSTRACT

A wafer carrier includes a base including a generally planar bottom surface and a top surface that includes a plurality of platforms extending above the top surface. The wafer carrier includes a thermal cover defining a plurality of pockets. The thermal cover is configured to be coupled to the base by at least one fastener and the plurality of pockets are arranged such that each pocket of the plurality of pockets is aligned with a corresponding platform of the plurality of the platforms when the thermal cover is supported by a plurality of first pedestals that extend from the top surface of the base. A plurality of second pedestals are located along the plurality of platforms for supporting the one or more wafers, wherein each platform includes at least one second pedestal that extends from a top surface of the platform for supporting one wafer.

26 Claims, 7 Drawing Sheets

(56) References Cited

U.S. PATENT DOCUMENTS

2020/0056284 A1* 2/2020 Mitrovic ........... H01L 21/68785
2020/0063287 A1 2/2020 Mitrovic et al.
2020/0279764 A1 9/2020 Morikawa
2023/0060609 A1 3/2023 Krishnan et al.

* cited by examiner

WAFER CARRIER ASSEMBLY WITH IMPROVED TEMPERATURE UNIFORMITY

CROSS-REFERENCE TO RELATED PATENT APPLICATIONS

This application claims the priority of U.S. Provisional Patent Application 63/409,557, filed Sep. 23, 2022, which is incorporated by reference as if expressly set forth in its entirety herein.

TECHNICAL FIELD

The present disclosure relates generally to semiconductor fabrication technology and more particularly, to a wafer carrier assembly for a chemical vapor deposition (CVD) reactor with a contoured base and a base pedestal for supporting the wafer to improve the management of thermal uniformity during the CVD process.

BACKGROUND

Certain processes for fabrication of semiconductors can require a complex process for growing epitaxial layers to create multilayer semiconductor structures for use in fabrication of high performance devices, such as light emitting diodes (LEDs), laser diodes, optical detectors, power electronics, and field effect transistors. In this process, the epitaxial layers are grown through a general process called Chemical Vapor Deposition (CVD). One type of CVD process is called Metal Organic Chemical Vapor Deposition (MOCVD). In MOCVD, reactant gases are introduced into a sealed reactor chamber within a controlled environment that enables the reactor gas to be deposited on a substrate (commonly referred to as a wafer) to grow thin epitaxial layers. Examples of current product lines for such manufacturing equipment include the TurboDisc®, MaxBright®, EPIK® families of MOCVD systems, and the PROPEL® Power GaN MOCVD system, all manufactured by Veeco Instruments Inc. of Plainview, NY.

During epitaxial layer growth, a number of process parameters are controlled, such as temperature, pressure, and gas flow rate, to achieve desired quality in the epitaxial layers. Different layers are grown using different materials and process parameters. For example, devices formed from compound semiconductors, such as III-V semiconductors, typically are formed by growing a series of distinct layers. In this process, the wafers are exposed to a combination of reactant gases, typically including a metal organic compound formed using an alkyl source including a group III metal, such as gallium, indium, aluminum, and combinations thereof, and a hydride source including a Group V element, such as NH3, AsH3, PH3, OR AN Sb metalorganic, such as tetramethyl antimony. Generally, the alkyl and hydride sources are combined with a carrier gas, such as N2 and/or H2, which does not participate appreciably in the reaction. In these processes, the alkyl and hydride sources flow over the surface of the wafer and react with one another to form a III-V compound of the general formula $In_X Ga_y AlzN_A\ A_{SB}\ P_C\ Sb_D$ where x+y+z equals approximately one, A+B+C+D equals approximately one, and each of x, y, z, A, B, C, D can be between zero and one. In other processes, commonly referred to as "halide" or "chloride" processes, the Group III metal source is a volatile halide of the metal or metals most commonly a chloride, such as GaCl2. In yet other processes, bismuth is used in place of some or all of the other Group III metals.

A suitable substrate for the reaction can be in the form of a wafer having metallic, semiconducting, and/or insulating properties. In some processes, the wafer can be formed of sapphire, aluminum oxide, silicon (Si), silicon carbide (SiC), gallium arsenide (GaAs), indium phosphide (InP), indium arsenide (InAs), gallium phosphide (GaP), aluminum nitride (AlN), silicon dioxide (SiO2), and the like.

In a CVD process chamber, one or more wafers are positioned within a tray, commonly referred to as a wafer carrier, so that the top surface of each wafer is exposed, thereby providing a uniform exposure of the top surface of the wafer to the atmosphere within the reactor chamber for the deposition of semiconductor materials. The wafer carrier is commonly rotated at a rotation speed on the order from about 50 to 1500 RPM or higher. While the wafer carrier is rotated, the reactant gases are introduced into the chamber from a gas distribution device, positioned upstream of the wafer carrier. The flowing gases pass downstream toward the wafer carrier and wafers, desirably in a laminar flow. One such example of a CVD process chamber is disclosed in U.S. Pat. No. 10,570,510, which is hereby expressly incorporated by reference in its entirety. The wafer carrier includes a carrier element having pockets for the semiconductor wafers, commonly referred to as a susceptor or platen or base, that is typically formed of a single bulk material, such as graphite or silicon carbide. In various embodiments, wafer carriers can include cover restraints positioned above the susceptor or platen or base to aid in defining the pockets and retaining the wafers within the pockets. Various configurations and shapes of susceptors/platens/bases and cover restraints have been developed to processing as disclosed, for example, in U.S. Pat. No. 8,888,919, which is hereby incorporated by reference in its entirety. The '919 patent also describes and illustrates a conventional chemical vapor deposition apparatus that can be used with the wafer carriers described herein.

During the CVD process, the wafer carrier is maintained at a desired elevated temperature by heating elements, often positioned beneath the wafer carrier. Therefore, heat is transferred from the heating elements to the bottom surface of the wafer carrier and flows upwardly through the wafer carrier to the one or more wafers. Depending on the process, the temperature of the wafer carrier is maintained on the order of between 450-1200° C. The reactive gases, however, are introduced into the chamber by the gas distribution devices at a much lower temperature, typically 200° C., or lower, so as to inhibit premature reaction of the gases.

In such an environment, it is generally desirable to maintain highly uniform deposition rates for the material or materials that are epitaxially grown. More uniform thicknesses of the wafer or constituent layers within the wafer results in lower waste or usable product. In a conventional chemical vapor deposition system that incorporates a thermal cover, heat is transferred from the susceptor/platen/base to the wafer substrates directly while the thermal transfer to the cover is reduced. A typical system will have a temperature difference of about 30° C. between the wafers and the substrate itself, and temperatures within the wafers can vary in a range of about 3-4° C., but even these small variations can impact wafer uniformity.

Accordingly, it is desirable to optimize temperature uniformity of the wafer carrier and reduce or eliminate areas which lie outside of the desired temperature profile of the wafer carrier.

SUMMARY

One deficiency of prior wafer carrier design is the presence of a lower temperature cold ring region along the wafer circumference. Prior wafer carrier designs supported the wafer on the thermal cover such as by positioning the wafer on a ledge or protrusion that is part of the thermal cover. In these designs, the outer edge of the wafer rests on the thermal cover and is suspended above the (platform) base of the wafer carrier. The outer edge of the wafer resting on the thermal cover has a lower temperature than the inner section of the wafer thus leading to a non-uniform temperature profile. The wafer carriers described herein overcome this deficiency by providing a pedestal support feature associated directly with the wafer carrier base as opposed to supporting the wafer on the thermal cover and thus, there is no contact between the wafer and the thermal cover.

Another deficiency of conventional wafer carriers is that there can be thermal hot spots on the thermal cover at the center and between wafers. In general, the greater the empty space in the center of the thermal cover and between the wafers, the greater the likelihood of thermal hot spotting and the greater the magnitude of the thermal hot spotting. Increased temperatures (hot spots) in the center of the thermal cover and between the inner edges of the wafers adversely impact the interior surfaces (inner portions) of the wafer that are closest to the center of the wafer carrier and the thermal cover. As a result of these hot spots, the wafer has a non-uniform temperature profile. In certain embodiments and optionally, the wafer carriers described herein are constructed to alleviate and/or eliminate thermal hot spots on the thermal cover center and between wafers by modifying the top surface of the base of the wafer carrier. More particularly, as described herein, a sloped center recessed area can be incorporated into the top surface of the base.

Accordingly, in one embodiment, a wafer carrier for use in a system for growing epitaxial layers on one or more wafers by chemical vapor deposition (CVD) is described and illustrated herein. The wafer carrier includes a base including a generally planar bottom surface and a top surface that is generally parallel to the bottom surface. The top surface further includes a plurality of first pedestals and a plurality of platforms extending above the top surface of the base. The wafer carrier includes a thermal cover defining a plurality of pockets. The thermal cover is configured to be coupled to the base by at least one fastener and the plurality of pockets are arranged such that each pocket of the plurality of pockets is aligned with a corresponding platform of the plurality of the platforms when the thermal cover is supported by the plurality of first pedestals. A plurality of second pedestals are located along the plurality of platforms for supporting the one or more wafers, wherein each platform includes at least one second pedestal that extends from a top surface of the platform for supporting one wafer.

BRIEF DESCRIPTION OF THE DRAWING FIGURES

Subject matter hereof may be more completely understood in consideration of the following detailed description of various embodiments in connection with the accompanying figures, in which.

Figures 1, 2:
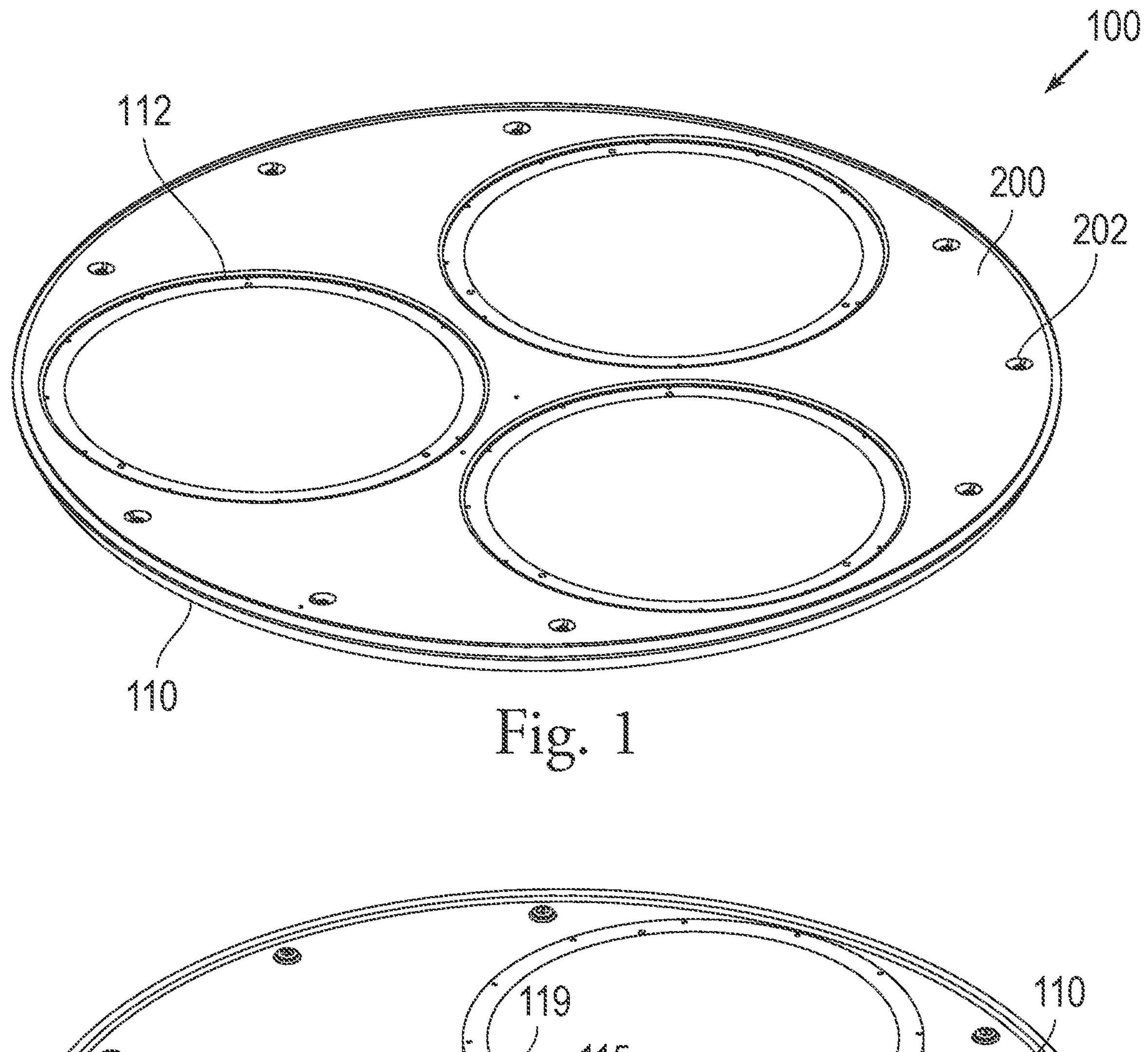
FIG. 1 is a perspective view of a wafer carrier according to an embodiment.
FIG. 2 is a perspective view of the wafer carrier of FIG. 1 with a thermal cover thereof being removed.

While various embodiments are amenable to various modifications and alternative forms, specifics thereof have been shown by way of example in the drawings and will be described in detail. It should be understood, however, that the intention is not to limit the claimed inventions to the particular embodiments described. On the contrary, the intention is to cover all modifications, equivalents, and alternatives falling within the spirit and scope of the subject matter as defined by the claims.

DETAILED DESCRIPTION OF THE DRAWING FIGURES

Embodiments described herein provide several improvements, some or all of which may individually or in combination may be applicable to the different embodiments, and each of which is described in more detail below.

Throughout the application, several terms that are known to those of skill in the art of chemical vapor deposition and similar systems are used. These terms may differ, in some cases, from the plain and ordinary meaning of these terms in common parlance. As used throughout this application, the following terms are defined as follows:

A base is a structure arranged in a reactor to receive the precursor gases. A base may have a variety of pockets defined therein, upon which wafers are grown. In embodiments, substrates are positioned within each of the pockets and the wafer is grown, via epitaxial growth in the reactor chamber, upon these substrates.

During growth of the wafers, the base is typically both heated and spun, along with the rest of the wafer carrier assembly. Heating provides energy to promote reaction of the precursor gases incident upon the substrates in the wafer carrier assembly, while spinning the wafer carrier assembly promotes uniformity of growth throughout the wafer.

A thermal cover is a structure that can be connected to a base. The thermal cover typically covers those portions of the base other than the pockets, such that the precursor gases can still access those pockets (and/or the wafers and bases that may be positioned therein).

Pedestals and platforms, while having similar meanings in everyday use, are defined herein to refer to different structures/regions of the wafer carrier assembly. A platform, as used herein, refers to a raised portion that is relatively large compared to a pedestal. A platform is arranged beneath a wafer or substrate and defines a height relative to the portions of the base that are not beneath a wafer or substrate. Pedestals, on the other hand, provide support for components (e.g., substrates, thermal covers, etc.) but are small enough to provide sufficient mechanical support without promoting any significant level of thermal transfer. A pedestal can extend upward from a platform.

Throughout this application, directions may be referred to. When one component is referred to as being "above" or "below" another, this refers to the typical orientation in which such systems are used. In a typical vapor deposition system, a showerhead or other sprayer for precursor chemical is arranged at the gravitational top of the reactor chamber. The wafer carrier assembly therefore has a thermal cover at the uppermost portion thereof. The heater is typically located blow the base, or in some embodiments within the base of the wafer carrier assembly. It should be understood that this directional language is used to refer to typical systems, but that alternative chemical vapor deposition or other epitaxial growth systems could be arranged differently. These directions are therefore used for use of discussion of the drawings and common implementations and should not be construed as limiting of the embodiments described herein.

As mentioned previously, in a typical chemical vapor deposition process, numerous wafers are held on a component commonly referred to as a wafer carrier so that a top surface of each wafer is exposed at the top surface of the wafer carrier. The wafer carrier is then placed into a reaction chamber and maintained at the desired temperature while the gas mixture flows over the surface of the wafer carrier. It is important to maintain uniform conditions at all points on the top surfaces of the various wafers on the carrier during the process. Minor variations in composition of the reactive gases and in the temperature of the wafer surfaces cause undesired variations in the properties of the resulting semiconductor devices.

Wafer carriers are often expressed in terms of the number of wafers that can be held and also the size of each wafer. For example, a 3×8" wafer carrier, such as the exemplary one shown in FIG. 1, is designed to hold three (3) wafer that are each 8" in diameter. FIGS. 4-7 illustrate an exemplary 15×4" wafer carrier that holds fifteen (15) wafers that are each 4" in diameter. It will be appreciated, that the less wafers on the wafer carrier, the less crowding and this leads to increased empty space between the individual wafers as discussed herein. It will be appreciated that the teachings of the present application can be implemented in wafer carriers having different sizes than the aforementioned.

Figure 3:
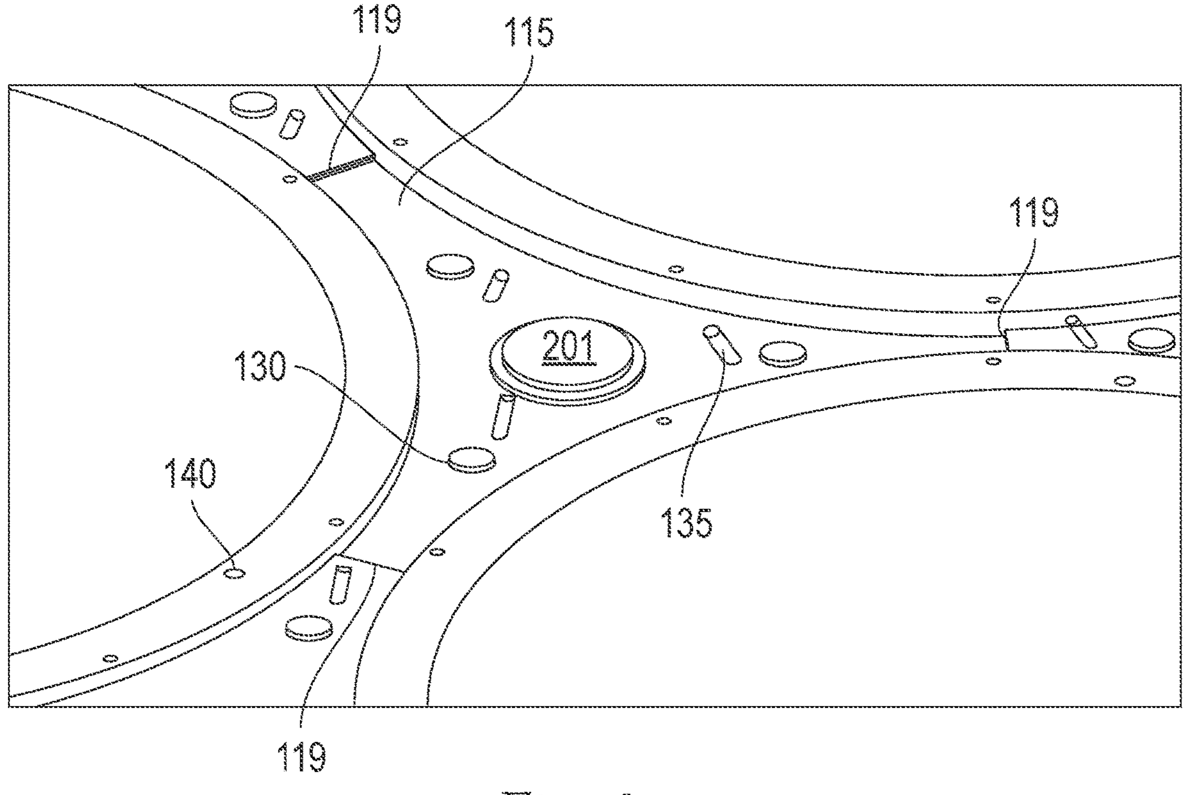
FIG. 3 is a detailed view of a center region of the wafer carrier of FIG. 1.
Figure 4:
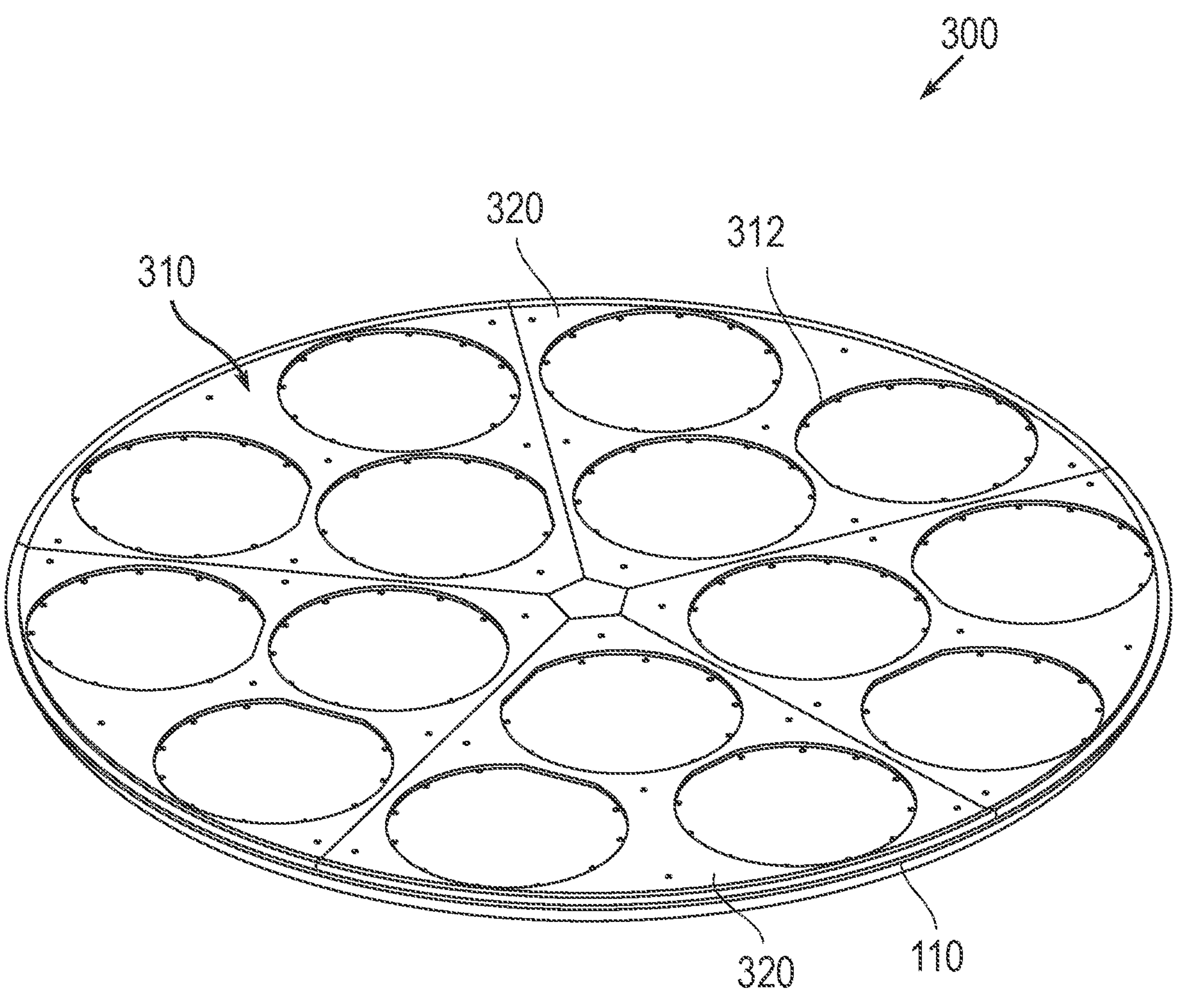
FIG. 4 is a perspective view of a wafer carrier according to another embodiment.
Figure 5:
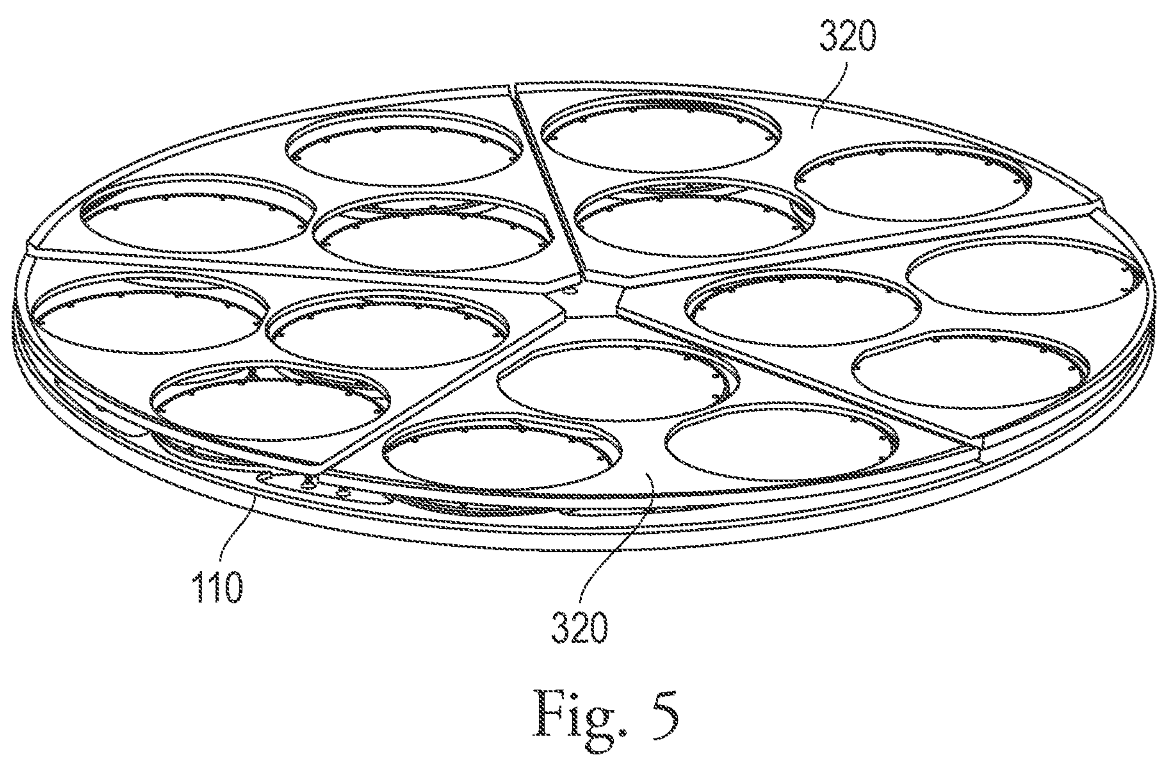
FIG. 5 is an exploded perspective view of the wafer carrier of FIG. 4.

FIGS. 1-3 are perspectives view of a wafer carrier 100 according to one exemplary embodiment. It will be understood that the wafer carrier 100 can also be thought of as being a wafer carrier assembly since it is formed of several parts/components that are attached to one another. The wafer carrier 100 includes a main body, commonly referred to as a base 110, and a thermal cover 200. The wafer carrier 100 includes a number of pockets 112, each of which corresponds to an aperture defined by the thermal cover 200. The pockets 112 are thus open along a top surface of the wafer carrier 100 and are arranged circumferentially about the wafer carrier 100, each such pocket being configured to removably receive a disc-like wafer 10 (FIG. 9) and to hold such wafer 10 during a MOCVD process (or other semiconductor fabrication process) such as that described below. Each wafer 10 is formed of a suitable wafer material, including but not limited, to sapphire, silicon carbide, silicon, or other crystalline substrate materials. Typically, each wafer 10 has a thickness which is small in comparison to the dimensions of its major surfaces. Each wafer 10 can disposed on or adjacent the wafer carrier 100 with a top surface thereof facing upwardly, so that the top surface of the wafer 10 is exposed and accessible at the top surface of the wafer carrier 100. The wafers 10 can be coplanar or nearly coplanar with the top surface of the wafer carrier 100.

The thermal cover 200 can either be a single piece as shown in FIG. 1 or have multiple overlapping segments as shown in FIGS. 4-7. This segmented design is described in more detail below and is more commonly found in larger sized wafer carriers.

Figure 6:
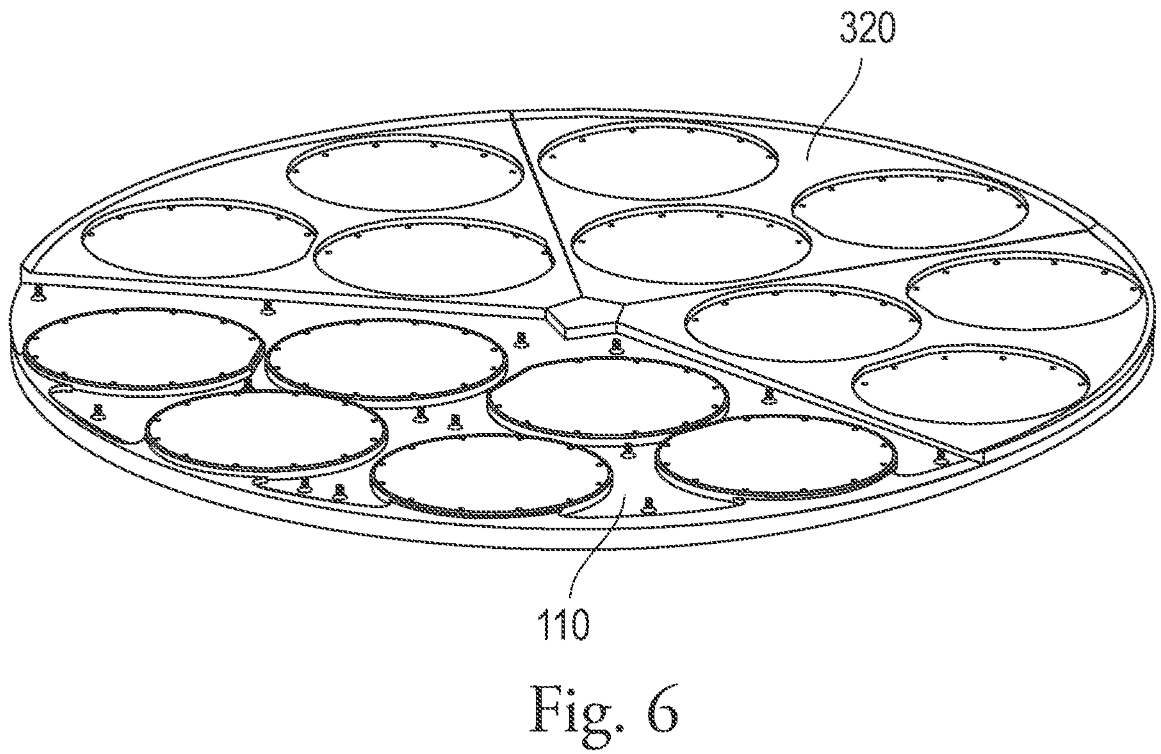
FIG. 6 is a perspective view of the wafer carrier of FIG. 4 showing two of the segmented thermal cover pieces removed.
Figure 7:
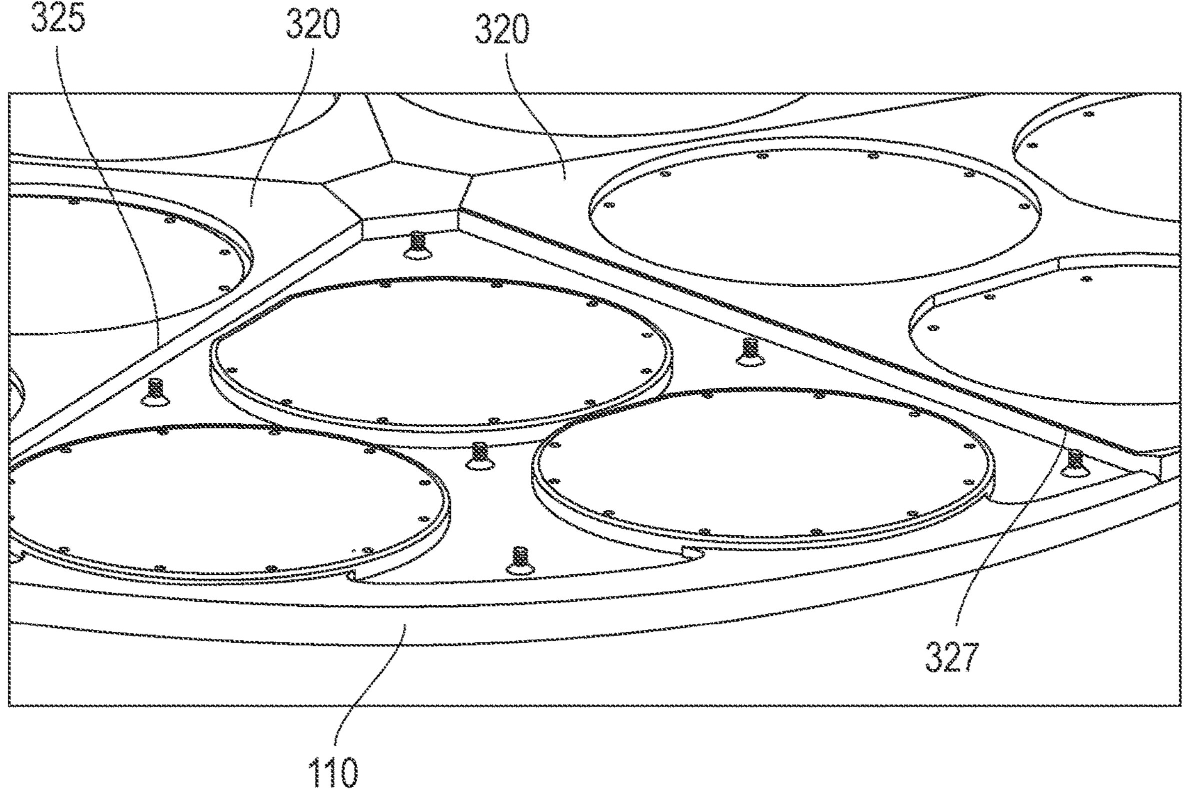
FIG. 7 is an enlarged fragmentary view of overlapping edges of the segmented thermal cover pieces.

While not shown in the figures, each of the pockets 112 can have a flat. As is known, flats can be used in chemical vapor deposition systems to lock a wafer (not shown) within the corresponding pocket 112 from rotation during epitaxial growth. In addition, as shown in FIGS. 6 and 7, each pocket can include tabs for supporting the wafer in certain embodiments.

The thermal cover 200 is coupled to the base 110 using traditional techniques, such as the use of fasteners or the like. For example, the surface of the thermal cover 200 includes a plurality of holes 202 and in the illustrated embodiment, the thermal cover 200 includes nine (9) holes 202. As described in more detail below, the holes 202 are small apertures through which fastening pins can be driven. In addition, screws can be used to fasten the thermal cover 200 to the base 110.

In certain embodiments, pins can be used in combination with screws to accomplish a desired level of restraint. Not all of the various implementations of this fastening arrangement are shown herein, and it should be understood that outer restraints are often screws, while radially inner restraints can be either angled pins or screws, to achieve a desired result. Some embodiments are a "pin-less" manifestation using backside screws to keep the thermal cover fastened on the inside. By going in from the backside in various embodiments, thermal imprints on the topside can be minimized or eliminated using either screws or pins. Any combination of restraints, properly positioned, using pins and screws, can be effective to prevent deformation of the thermal cover 200 that results in temperature non-uniformity.

FIG. 3 shows pins 135 connecting the thermal cover 200 to the base 110. The pins 135 can be angled to prevent thermal cover 200 from being lifted away from the base 110.

The 3×8" wafer carrier can use pins and screws, while the 15×4" carrier does not require pins.

In general, during epitaxial growth of a substrate in a CVD system, the wafer carrier 100 is positioned in a reactor chamber and heated from beneath—that is, from the opposite side from the pockets 112. The chamber is generally under vacuum, with some gases introduced from one or more sources directed towards the wafer carrier 100 such that it flows across the top surface thereof. The gases can include purge gases and one or more precursor gases that will react, when heated, to deposit a desired material in the pockets 112.

During a typical CVD process, it is desirable to produce growth at the pockets 112 in a manner that is uniform, predictable, and consistent from run to run. It is also desirable to reduce the amount of system time required to create each wafer 10, whether by increasing run speed or by reducing system downtime. System downtime can be required for cleaning, for example, when unwanted material deposition occurs where it is not desired.

Thermal covers 200 can introduce other variables that negatively impact the ability to create uniform, predictable and consistent growth across the pockets 112. For example, if surfaces of wafter 10 sitting above pockets 112 are significantly hotter or colder than the surrounding thermal cover 200, as is the case for conventional single-piece wafer carriers, then gases flowing across the surface of the wafer carrier 100 can exhibit temperature gradients and result in non-uniform deposition. In contrast, as described herein, thermal covers can prevent such temperature disparities, or can be used to tune the temperature disparities as desired by adjustment of the thermal gaps between the components/parts thereof.

Likewise, thermal cover 200 can prevent physical obstructions to the flow of precursor gases that affect the quality of the epitaxial growth at the pockets 112. Rotation of the wafer carrier during deposition generally improves uniformity and maintain uniformity between the various pockets 112 therein. However, deformation of the thermal cover 200 can affect space between parts of the wafer carrier 100, which in turn affects heat transfer characteristics of the overall device and can affect the fluid layer height. It will be appreciated that the fluid boundary layer can also affect growth rate and in particular, small variations in affecting the fluid boundary layer will have an impact of the growth rate uniformity. With these characteristics affected by unwanted deformation, different areas may be hotter or colder and deposition rates and patterns can be affected. These patterns result in uneven deposition and non-uniformity thicknesses, and so are generally not desired. Accordingly, it is beneficial to control deformation of the thermal cover 200 to maintain a generally flat, uniform surface that is not significantly dished/bowl-shaped or bowed/hilltop shaped relative to a plane represent the ideal flat, uniform surface. The flatness of the cover can also become non-planar due to the film stress from the deposited materials on its surface.

As mentioned herein, non-uniform temperature profiles are a concern and the wafer carriers disclosed herein are constructed to provide more uniform temperature profiles and overcome localized non-uniform temperature profiles associated with prior wafer carriers. More particularly, prior wafer carrier designs have been susceptible to the following deficiencies: 1) thermal "hot spots" on the thermal cover at the center and between the wafers; and 2) a low temperature "cold ring" region along the wafer circumference. These issues combined to reduce the overall wavelength uniformity and device yield and therefore, the present wafer carriers have improved overall wafer temperature and wavelength uniformity.

Inner Thermal Hot Spots

One deficiency of conventional wafer carriers is that there can be thermal hot spots on the thermal cover at the center and between wafers. In general, the greater the amount of empty space in the center of the thermal cover and between the wafers, the greater the likelihood of thermal spotting and the greater the magnitude of the thermal spotting. Increased temperatures (hot spots) in the center of the thermal cover and between the inner edges of the wafers adversely impact the interior surfaces (inner portions) of the wafer that are closest to the center of the wafer carrier and the thermal cover. As a result of these hot spots, the wafer has a non-uniform temperature profile.

The wafer carriers described herein are constructed to alleviate and/or eliminate thermal hot spots on the thermal cover center and between wafers by modifying the top surface of the base of the wafer carrier. Now referring to FIGS. 2, 3 and 8, the top surface of the base 110 of the wafer carrier is modified in such a way that reduces and/or eliminate thermal hot spotting at the center of the thermal cover 200 and between the wafers 10. In particular, the top surface of the base 110 that surrounds the center of the wafer carrier 100 is modified to include a localized feature that dissipates the thermal hot spotting in the cover center and between the wafers 10. This modification is in the form of an area of reduced thickness of the base 110 surrounding the center of the wafer carrier 100 and thermal cover 200 and outside of the areas at which platforms are formed. This modification is introduced to reduce the cover temperature in the center of the wafer carrier 100.

The modification comprises a removal of material from the top surface of the base 110 to further modulate the cover temperature in a center region thereof. Removal of base material results in the formation of a sloped center recessed area 115 of the base 110. FIG. 2 shows the base 110 without the thermal cover 200 and shows the location of the sloped center recessed area 115. As shown, the sloped center recessed area 115 is formed about a center of the base 110 and is formed in areas between the wafer receiving areas of the base 110. In the embodiment shown in FIG. 2, there are three wafer receiving areas and therefore, the sloped center recessed area 115 can be described as containing three spokes that extend radially outward from the center. As best shown in FIG. 3, within the sloped center recessed area 115, there can be mounting features, such as openings that allow for passage of mounting hardware such as pins and/or screws to couple the thermal cover 200 to the base 110. In addition, other support features can be provided within the sloped center recessed area 115. For example, at the direct center of the wafer carrier a larger pedestal 201 can be provided as shown in FIGS. 3 and 8.

The interface between the sloped center recessed area 115 and the surrounding planar portions of the base 110 are defined by outer edges or shoulders or steps 119. In the illustrated embodiment of FIG. 2, there are three steps 119 as a result of the tri-spoke construction of the sloped center recessed area 115.

Figure 8:
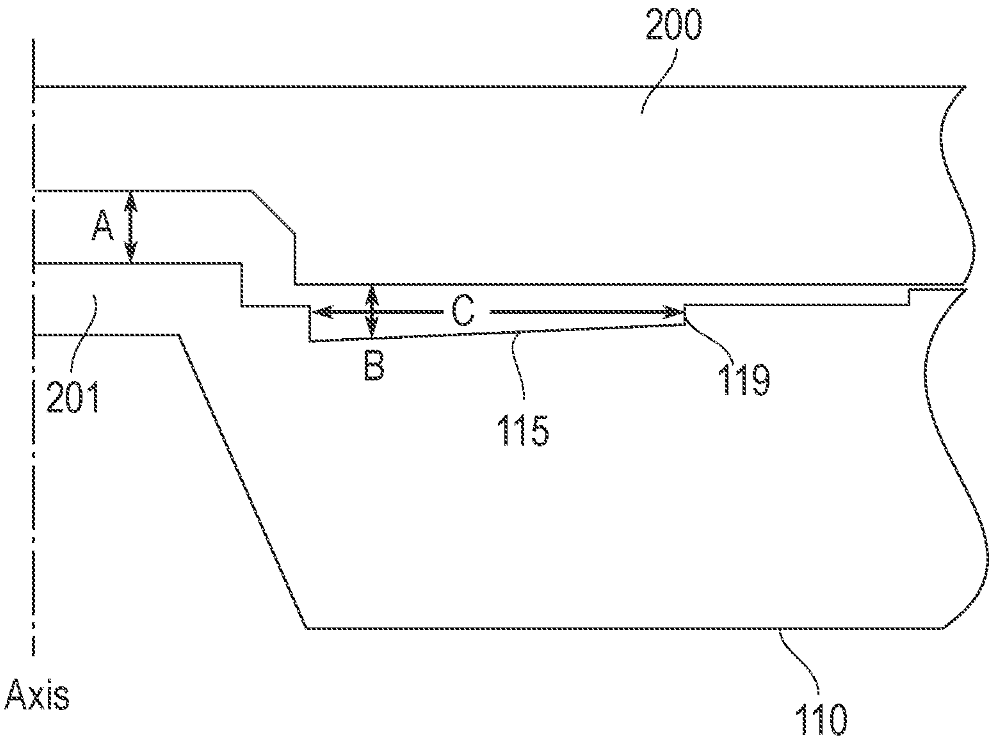
FIG. 8 is an enlarged fragmentary cross-sectional view of a center section of the wafer carrier showing a modification for dissipating and/or eliminating hot spotting in the center of the wafer carrier.

As shown in FIG. 8, the sloped center recessed area 115 can be described in terms of a dimension B and a dimension C. The dimension B is distance between the top surface of the base 110 and the thermal cover 200. It will be appreciated that this dimension B is not constant along the length/width (dimension C) of the sloped center recessed area 115 in view of the sloped center recessed area 115 being defined by a sloped (angled) surface. The sloped center recessed area 115 slopes downward toward the center of the wafer carrier 100 and as a result, the dimension B is greater toward the center.

The slope of the sloped center recessed area 115 can be expressed in terms of an angle. For example, in one embodiment for a wafer carrier of a first type, the angle is 0.41826" and in another embodiment for a wafer of another type, the angle is 0.55330". It will be appreciated that these values are only exemplary and many different other slope angles can be used. In particular, the slope of the sloped center recessed area 115 is driven by the temperature profile of the wafer carrier design. As mentioned, the greater the empty space in the wafer carrier, the greater the slope angle and for certain more crowded wafer carrier designs, like the 15×4" wafer carrier, there may be no need for inclusion of this feature and for the provision and incorporation of the sloped center recessed area 115 in the wafer carrier. Thus, this heat dissipation feature is optional for certain wafer carrier designs and can be eliminated and not included in certain wafer carriers that do not benefit from such feature.

In addition, the dimension A, shown in FIG. 8, represents a gap having a distance between the thermal cover 200 and the pedestal portion of the base 110. This gap A increases the cover-to-pedestal gap in the center of the thermal cover to reduce cover temperature.

In one example, the dimension A=0.2 mm to 2 mm; dimension B=0.3 mm to 2 mm and C=0 to 65 mm. For those wafer carriers that do not include this optional heat dissipation feature, C=0. It will be appreciated and understood that the aforementioned values are only exemplary and not limiting of the scope of the present invention.

Pedestal Wafer Support Feature

As mentioned above, another deficiency of prior wafer carrier design is the presence of a lower temperature cold ring region along the wafer circumference. Prior wafer carrier design supported the wafer on the thermal cover such as by positioning the wafer on a ledge or protrusion that is part of the thermal cover. In these designs, the outer edge of the wafer rests on the thermal cover and is suspended above the base of the wafer carrier. The outer edge of the wafer resting on the thermal cover has a lower temperature than the inner section of the wafer thus leading to a non-uniform temperature profile.

The wafer carriers described herein overcome this deficiency by providing a pedestal support feature associated with the wafer carrier base as opposed to supporting the wafer on the thermal cover.

Figure 9:
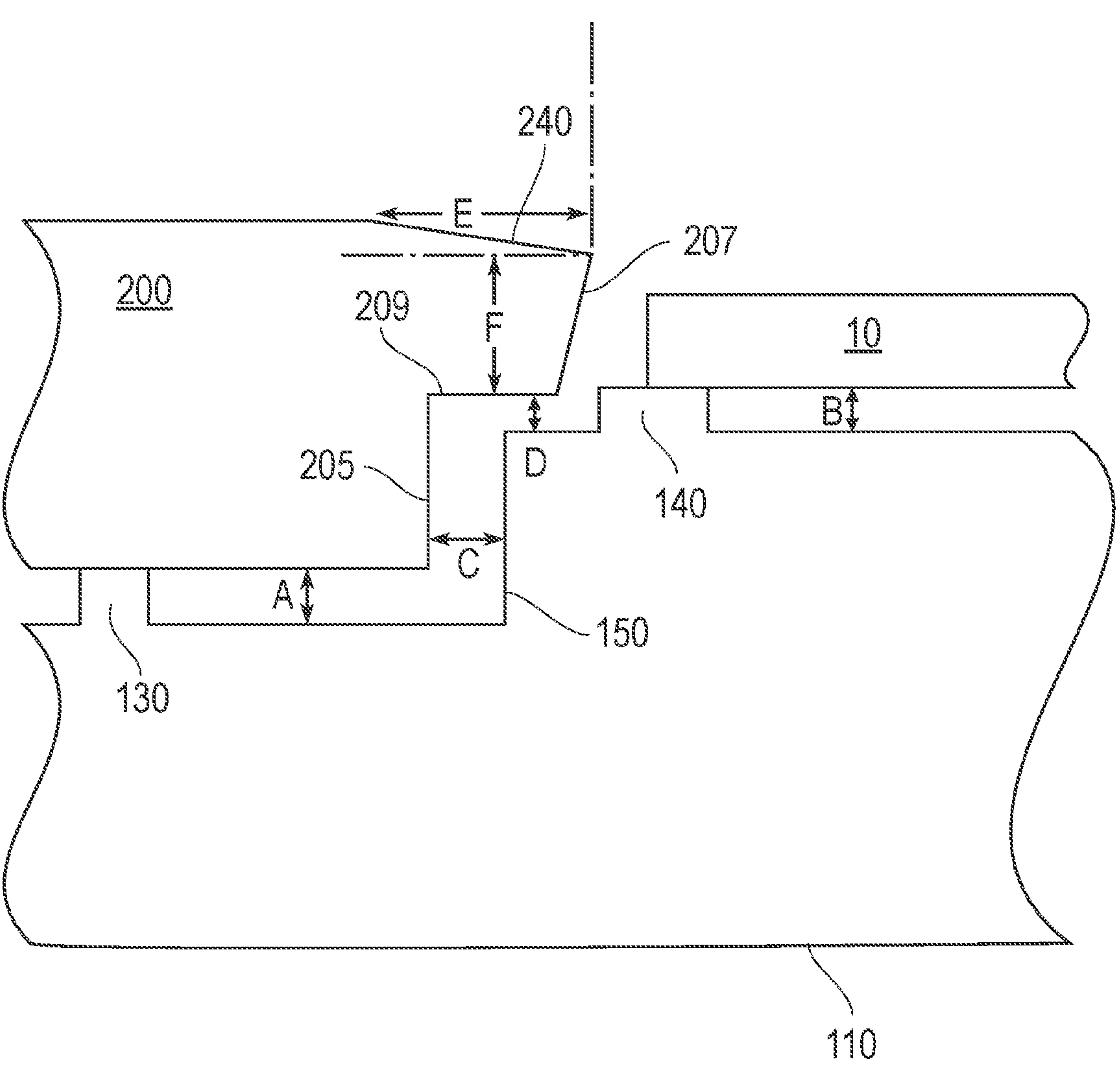
FIG. 9 is an enlarged fragmentary cross-sectional view of a pedestal wafer support feature of the wafer carrier.

Now referring to FIG. 9 which shows a pedestal support feature for supporting wafer 10 according to the present disclosure. The platform of the base 110 of the wafer carrier 100 includes one or more first pedestals 130 located along a top surface of the base 110 and one or more second pedestals 140 also located along the top surface of platform of the base 110. The one or more second pedestals 140 are located within the pocket of the wafer carrier 100, while the one or more first pedestals 130 are located radially outward from the one or more second pedestals 140. While the term "pedestal" is used to describe each of the structures identified at 130, 140, it will be understood that these can also be described as being support tabs or the like.

The base 110 in FIG. 9 can be thought of as having a first region in which the one or more first pedestals 130 is recessed relative to a second region (defined by the platforms) in which the one or more second pedestals 140 are located. A wall 150 is located between one first region and one second region. The wall 150 is formed at a right angle to the top surface in the first region and the top surface in the second region (i.e., wall 150 extends from the top surface of the base to the top surface of the platform).

The one or more first pedestals 130 are located radially outward from the wall 150 and are constructed to support the thermal cover 200. In one embodiment, each of the one or more first pedestals 130 comprises a plurality of discrete pedestals (pads) on which the thermal cover 200 rests; however, other constructions are possible.

As described in more detail below, the one or more second pedestals 140 provide a surface on which the wafer 10 rests within the pocket. In one embodiment, each of the one or more second pedestals 140 comprises a single continuous annular shaped pedestal on which the wafer 10 rests. In another embodiment, each of the one or more second pedestals 140 comprises a plurality of discrete tabs that are spaced circumferentially apart from one another and thus define a discontinuous surface on which the wafer 10 rests.

The thermal cover 200 includes pockets, as mentioned above, in which the wafer 10 is located. The thermal cover 200 is constructed in view of the profile of the platform of the base 110. For example, the pocket of the thermal cover 200 is defined by an inner edge of the thermal cover 200 which has a profile that is complementary to the platform shape. More specifically, the inner edge of the thermal cover 200 that defines one pocket includes a first inner edge 205 and a second inner edge (inner circumferential edge) 207 that is located above the first inner edge 205. The first inner edge 205 is located radially outward from the second inner edge 207. The first inner edge 205 is parallel to the wall 150. In the illustrated embodiment, the first and second inner edges 205, 207 are formed in a non-parallel manner. A first bottom edge 209 is located between the first inner edge 205 and the second inner edge 207. The first bottom edge 209 is formed perpendicular to the first inner edge 205 and intersects the second inner edge 207 such that an angle between the second inner edge 207 and the first bottom edge 209 is other than 90 degrees.

Moreover, the top surface of the thermal cover 200 can include an angled section 240 that surrounds each pocket. A shown, this angled section 240 has a downward slope in a direction toward the pocket. The angled or sloped section 240 intersects the second inner edge 207. This angled section 240 has an annular shape and surrounds the pocket opening. The width of the angled section 240 can be selected based on a number of factors discussed herein. The angled section 240 promotes smooth gas flow into and out of the pockets and in particular gas flow around the outer wafer edge.

As shown in FIG. 9, the thermal cover 200 partially overhangs (overlaps) the elevated platform from which the one or more second pedestals 140 protrude upwardly. In particular, an inner portion of the first bottom edge 209 and the second inner edge 207 are located above the elevated platform but radially outward from the one or more second pedestals 140.

The second inner edge 207 provides a lateral mechanical restraint for the wafer 10. In other words, this second inner edge 207 prevents undesirable movement of the wafer 10 within the pocket and prevents the wafer 10 from flying off of the one or more second pedestals 140.

As mentioned, in contrast to conventional wafer carrier design, the one or more second pedestals 140 support the outer edge of the wafer 10. This design prevents the outer wafer edge from losing heat to the colder thermal cover 200 and eliminates the undesired low temperature "cold ring" region along the wafer circumference.

FIG. 9 has a number of labels for certain dimensions that define the construction and features of the wafer carrier 100. For example, dimension A is a distance (gap) between the thermal cover 200 and the top surface of the platform in the recessed area in which the one or more first pedestals 130 are located. This dimension A is selected to equalize average wafer and cover top surface temperatures. Dimension B is a distance between the wafer 10 and the top surface of the platform beneath the wafer 10. This dimension B prevents bowed wafer from touching the platform during the fabrication process. Dimensions C and D are distances (gaps) between the thermal cover 200 and the platform of the base 110. Dimension C is a distance between the first inner edge 205 and the wall 150, while dimension D is a distance between the first bottom edge 209 and the top surface of the elevated platform of the base 110. These dimensions C and D are calibrated to optimize edge temperature of the wafer. Dimension E is the width of the angled section 240 at the inner edge of the thermal cover 200 that defines on pocket. Dimension F is the height of the second inner edge 207. Dimensions E and F are designed to provide smooth gas flow around the wafer edge.

In one example, the dimension A=0.2 mm to 2 mm; dimension B=0.2 mm to 0.4 mm; dimension C=0.5 mm to 1.5 mm; dimension D=0.2 mm to 0.5 mm; dimension E=1 mm to 3 mm; and dimension F=0.5 mm to 2 mm. For those wafer carriers that do not include this optional heat dissipation feature, C=0. It will be appreciated and understood that the aforementioned values are only exemplary and not limiting of the scope of the present invention.

It will be understood that the pedestal wafer support feature shown in FIG. 9 can be incorporated into the wafer carrier 100 of FIGS. 1-3 and the wafer carrier of FIGS. 4-7, that is described below, as well as within other wafer carrier designs. In addition, it will be understood that the pedestal wafer support feature of FIG. 9 can be used in combination with the sloped center recessed area 115 or can be used without such feature. As previously discussed, the inclusion of the sloped center recessed area 115 is optional and is dependent on the characteristics of the wafer carrier, such as size and wafer number and spacing.

FIGS. 4-7 are perspectives views of a wafer carrier 300 according to another exemplary embodiment and in particular, the wafer carrier 300 is of a 15×4" design. For this sized wafer carrier, the thermal cover is most often of a multi-piece (segmented) construction.

The wafer carrier 300 includes base 110 and includes the pedestal wafer support feature of FIG. 9; however, it does not include the sloped center recessed area 115 of FIG. 7 since it does not include the degree of empty spaces in the center as is the case with wafer carrier 100 of FIGS. 1-3.

It will be understood that the wafer carrier 300 can also be thought of as being a wafer carrier assembly since it is formed of several parts/components that are attached to one another. The wafer carrier 100 includes a main body, e.g., the base 110, and a thermal cover 310. The wafer carrier 100 includes a number of pockets 312, each of which corresponds to an aperture defined by the thermal cover 310. The pockets 312 are thus open along a top surface of the wafer carrier 100 and are arranged circumferentially about the wafer carrier 100, each such pocket being configured to removably receive a disc-like wafer 10 (FIG. 9) and to hold such wafer 10 during a MOCVD process (or other semiconductor fabrication process) such as that described below.

The thermal cover 310 is defined by a plurality of thermal cover pieces (segments), generally indicated at 320, that engage one another to define the assembled thermal cover 310. In FIGS. 4-7, there are five (5) thermal cover pieces 320 arranged about the center of the wafer carrier. While the illustrated thermal cover pieces 320 are generally of the same size, there are differences. For example, an interlocking mechanism can be provided to couple the thermal cover pieces together. As shown in FIG. 7, a first side edge of each thermal cover piece 320 includes a first locking feature, generally indicated at 325, while an opposite second side edge of the thermal cover piece 320 includes a second locking feature, generally indicated at 327. The first and second locking features are complementary to one another and define an overlapping structure when adjacent thermal cover pieces 320 mate together. For example, the first and second locking features can be male/female parts. In FIG. 7, the first locking feature 325 is a female part, while the second locking feature 327 is a male part. When two adjacent thermal cover pieces 320 engage one another, the male second locking feature 327 sits within the stepped first locking feature 325 to provide a seal due to overlapping structures.

Example—CVD Apparatus and Processing Conditions

A conventional chemical vapor deposition apparatus includes a reaction chamber that has a gas inlet manifold arranged at one end of the chamber. The end of the chamber having the gas inlet manifold is referred to herein as the "top" end of the chamber. This end of the chamber typically, but not necessarily, is disposed at the top of the chamber in the normal gravitational frame of reference. Thus, the downward direction as used herein refers to the direction away from the gas inlet manifold; whereas the upward direction refers to the direction within the chamber, toward the gas inlet manifold, regardless of whether these directions are aligned with the gravitational upward and downward directions.

A spindle is arranged within the chamber for rotation about a vertical central axis. The central axis of the spindle extends in the upward and downward directions of the reaction chamber. The spindle is mounted to the chamber by a conventional rotary pass-through device incorporating bearings and seals so that the spindle can rotate about the central axis, while maintaining a seal between the spindle and the base plate of the chamber. The spindle is connected to a rotary drive mechanism such as an electric motor drive, which is arranged to rotate the spindle about the central axis. The spindle can also be provided with internal coolant passages extending generally in the axial directions of the spindle within the gas passageway. The internal coolant passages can be connected to a coolant source, so that a fluid coolant can be circulated by the source through the coolant passages and back to the coolant source. The wafer carrier (e.g., wafer carrier 100, 300) is mounted on the spindle, such that the central axis of the wafer carrier is coincident with the axis of the spindle.

The wafer carrier is maintained at the desired elevated temperature by heating elements, typically electrical resistive heating elements disposed below the bottom surface of the wafer carrier. These heating elements are maintained at a temperature above the desired temperature of the wafer surfaces, whereas the gas distribution element typically is maintained at a temperature well below the desired reaction temperature so as to prevent premature reaction of the gases. Therefore, heat is transferred from the heating elements to the bottom surface of the wafer carrier and flows upwardly through the wafer carrier to the individual wafers.

In operation, the spindle is typically rotated at a rotational speed from 400-800 revolutions per minute for certain MOCVD processes, with a typical RPM being 500 RPM. In some embodiments, a typical deposition range is from 25 to 100 Torr, usually in an H2 ambient. Small amounts of N2 can be added to the total flow, but those are typically <5%. Typically, the wafer is maintained at a temperature on the order of 500-750° C. during deposition of material. It will be understood that the aforementioned values relate to AsP deposition and other materials can be deposited at higher or lower pressures and/or higher or lower temperature ranges. It will be appreciated that the aforementioned parameters are only exemplary for certain embodiments and can vary depending upon the precise processing operation being implemented.

In one embodiment, the thermal cover can be formed of graphite and the base also can be formed of graphite. However, other materials, such as those described herein, can be used. For example, the thermal cover and/or base could be formed of SiC or be coated with an SiC coating.

It is to be understood that like numerals in the drawings represent like elements through the several figures, and that not all components and/or steps described and illustrated with reference to the figures are required for all embodiments or arrangements.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

The subject matter described above is provided by way of illustration only and should not be construed as limiting. Various modifications and changes can be made to the subject matter described herein without following the example embodiments and applications illustrated and described, and without departing from the true spirit and scope of the present invention, which is set forth in the following claims.

What is claimed is:

1. A wafer carrier for use in a system for growing epitaxial layers on one or more wafers by chemical vapor deposition (CVD), the wafer carrier comprising:

a base including a generally planar bottom surface and a top surface that is generally parallel to the bottom surface, wherein the top surface of the base includes a plurality of first pedestals and a plurality of platforms extending above the top surface; and a thermal cover defining a plurality of pockets, wherein the thermal cover is configured to be coupled to the base by at least one fastener and the plurality of pockets are arranged such that each pocket of the plurality of pockets is aligned with a corresponding platform of the plurality of the platforms when the thermal cover is supported by the plurality of first pedestals;

wherein a plurality of second pedestals are located along the plurality of platforms for supporting the one or more wafers, wherein each platform includes at least one second pedestal that extends from a top surface of the platform for supporting one wafer;

wherein the top surface of the base includes a sloped center recessed section at a center region of the base in areas between the platforms, the thermal cover covering the sloped center recessed section.

2. The wafer carrier of claim 1, wherein each pocket includes one single continuous second pedestal that has an annular shape for supporting one wafer.

3. The wafer carrier of claim 1, wherein each pocket includes a plurality of second pedestals in the form of discrete tabs that are arranged circumferentially for supporting one wafer.

4. The wafer carrier of claim 1, wherein the plurality of first pedestals comprises a plurality of discrete pads on which the thermal cover seats.

5. The wafer carrier of claim 1, wherein the plurality of first pedestals are located radially outward from the plurality of platforms that include the plurality of second pedestals.

6. The wafer carrier of claim 5, wherein the plurality of second pedestals are elevated relative to the plurality of first pedestals.

7. The wafer carrier of claim 1, wherein the thermal cover partially overlaps the plurality of platforms.

8. The wafer carrier of claim 1, where each platform is defined by an outer wall that extends upwardly from the top surface of the base, wherein a height of the outer wall is greater than a height of each first pedestal.

9. The wafer carrier of claim 1, wherein each platform includes an outer peripheral region located radially outward from the at least one second pedestals of the platform, the thermal cover overlapping the outer peripheral region in each pocket.

10. The wafer carrier of claim 9, wherein each pocket of the thermal cover is defined by an inner circumferential edge that is located radially outward from the at least one second pedestals for providing lateral mechanical restraint for the wafer within the pocket.

11. The wafer carrier of claim 10, wherein the inner circumferential edge is at an angle other than 90 degrees relative to a planar top surface of the platform.

12. The wafer carrier of claim 1, wherein a top surface of the thermal cover immediately surrounding each pocket is defined by a downwardly angled section that defines and circumferentially surrounds one pocket.

13. The wafer carrier of claim 1, wherein the one or more wafers are free of direct contact with the thermal cover.

14. The wafer carrier of claim 1, wherein a distance between a top surface of the platform and the thermal cover is between 0.2 mm and 0.4 mm and wherein a distance between an underside of the thermal cover and the top surface of the base is between 0.2 mm and 2 mm and wherein a distance between the thermal cover and the top surface of the platform is between 0.2 mm and 0.5 mm.

15. The wafer carrier of claim 1, wherein a step is formed between the sloped center recessed area and surrounding planar sections of the top surface.

16. The wafer carrier of claim 1, wherein the sloped center recessed area slopes downward toward a center point of the base.

17. The wafer carrier of claim 1, wherein an angle of the sloped center recessed area is less than 1 degree.

18. The wafer carrier of claim 1, wherein the thermal cover comprises a segmented thermal cover comprising a plurality of thermal cover pieces that interlock with one another to form the thermal cover.

19. A wafer carrier for use in a system for growing epitaxial layers on one or more wafers by chemical vapor deposition (CVD), the wafer carrier comprising:

a base including a generally planar bottom surface and a top surface that is generally parallel to the bottom surface, wherein the top surface includes a plurality of platforms extending above the top surface of the base; and a thermal cover defining a plurality of pockets, wherein the thermal cover is configured to be coupled to the base by at least one fastener and the plurality of pockets are arranged such that each pocket of the plurality of pockets is aligned with a corresponding platform of the plurality of the platforms when the thermal cover is supported by a plurality of first pedestals of the base;

wherein the base includes a plurality of second pedestals that extend from top surfaces of the plurality of platforms for supporting the one or more wafers in such a way that the one or more wafers are free of direct contact with the thermal cover during operation;

wherein the top surface of the base includes a sloped center recessed section at a center region of the base in areas between the platforms, the thermal cover covering the sloped center recessed section, wherein the sloped center recessed section has a planar floor that extends between first and second steps formed in the top surface and sloped downward toward a center of the base.

20. The wafer carrier of claim 1, wherein the sloped center recessed section has a planar floor that extends between first and second steps.

21. The wafer carrier of claim 20, wherein the first and second steps are perpendicular to the top surface of the base.

22. The wafer carrier of claim 1, further including a center pedestal that is located at a center of the base, the sloped center recessed section surrounding the center pedestal, a top surface of the center pedestal being located above the sloped center recessed section.

23. The wafer carrier of claim 1, wherein the sloped center recessed section extends radially outward from the center of the base and is defined by a plurality of legs with each leg being located between two adjacent platforms of the plurality of platforms.

24. The wafer carrier of claim 1, wherein each platform is defined by an outer wall that extends above a top surface of one respective first pedestal and extends below one respective second pedestal, wherein each pocket of the cover including a first inner edge that faces the outer wall and extends to a first bottom edge, the first bottom edge partially overlapping an outer perimeter of one respective platform, the cover further including a second inner edge that intersects the first bottom edge and an angled section of the cover that defines a portion of the top surface of the cover, the second inner edge being formed at an angle other than 90 degrees relative to the first bottom edge.

25. The wafer carrier of claim 24, wherein the second inner edge is angled inward toward the second pedestal and the second inner edge is located between the outer wall and the second pedestal.

26. The wafer carrier of claim 24, wherein a first distance between the first inner edge and the outer wall is greater than a second distance between the first bottom edge and a top surface of the platform that is spaced from the second pedestal.

* * * * *